United States Patent

[11] 3,610,955

[72] Inventors Lawrence M. Blaser
Mountain View;
Norman P. Doyle, Los Altos, both of Calif.
[21] Appl. No. 60,019
[22] Filed July 31, 1970
[45] Patented Oct. 5, 1971
[73] Assignee Fairchild Camera and Instrument Corporation
Mountain View, Calif.

[54] BALANCED SYNCHRONOUS DETECTOR
11 Claims, 7 Drawing Figs.

[52] U.S. Cl. 307/235, 178/5.4 SY, 307/313, 328/146, 330/30 D, 330/69
[51] Int. Cl. H03K 5/20
[50] Field of Search 178/5.4 SY, 5.4 AC; 330/30 D, 69, 29, 38 M; 307/264, 235, 313; 328/146

[56] References Cited

UNITED STATES PATENTS

| | | | |
|---|---|---|---|
| 3,531,730 | 9/1970 | Steckler | 330/30 D |
| 3,551,836 | 12/1970 | Greeson | 330/30 D |
| 3,440,554 | 4/1969 | McGraw | 330/30 D |

OTHER REFERENCES

IEEE Trans. Broadcast & TU Receivers, Vol. BTR-12; pp. 54- 60, Nov. 1966, FIG. 7. Color TV Processing Using Integrated Circuits, Larry Blaser & Derek Bray.

*Primary Examiner*—Donald D. Forrer
*Assistant Examiner*—David M. Carter
*Attorneys*—Roger S. Borovoy, Alan H. MacPherson and Charles L. Botsford

ABSTRACT: A balanced synchronous detector circuit is constructed of two pairs of transistors. The first pair of transistors are interconnected so that the collector currents of these transistors are equal. The second pair of transistors contains one transistor, the collector current of which is controlled by the amplitude of the input signal applied to the emitters of the transistors in the second pair. The collectors of the first and second transistors in the first pair are connected to the collectors of the first and second transistors of the second pair. The difference between the collector current drawn by one of the transistors in the second pair and the collector current supplied by the corresponding transistor in the first pair is used to charge or discharge a capacitor, the voltage level on which is used to correct the frequency, phase, or amplitude of one signal to match the frequency, phase, or amplitude of a second signal.

PATENTED OCT 5 1971 3,610,955
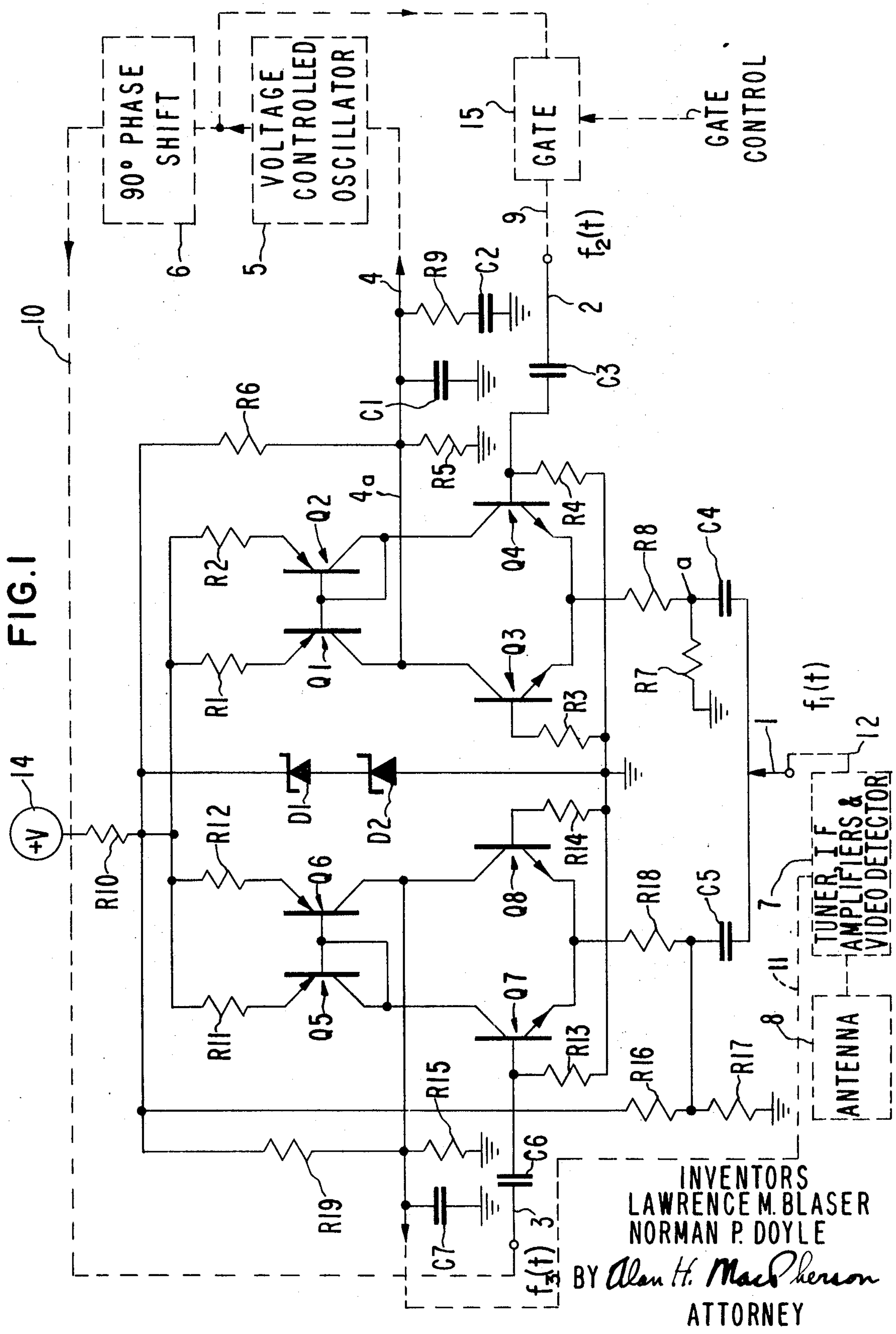
FIG. I
INVENTORS
LAWRENCE M. BLASER
NORMAN P. DOYLE
BY Alan H. MacPherson
ATTORNEY INVENTORS
LAWRENCE M. BLASER
NORMAN P. DOYLE
BY Alan H. MacPherson
ATTORNEY INVENTORS
LAWRENCE M. BLASER
NORMAN P. DOYLE
BY Alan H. MacPherson
ATTORNEY

BALANCED SYNCHRONOUS DETECTOR

BACKGROUND OF THE INVENTION

1. Field of the Invention

This invention relates to balanced synchronous detectors and in particular to a balanced synchronous detector using pairs of matched transistors, such that the circuit is particularly suitable for production in integrated circuit form.

2. Prior Art

In color television receivers it is necessary to control an oscillator in the receiver in order to provide a reference signal for demodulation of the color information. This oscillator, often called the color subcarrier regenerator, is controlled by a voltage proportional to the phase and frequency difference between the locally generated signal and an eight-cycle burst of the reference frequency transmitted from the TV station. The generation of this control voltage is often accomplished in a discriminator circuit which requires a transformer which is expensive and difficult to adjust. Furthermore, the signal levels required for efficient operation of the discriminator type of circuit are much higher than can easily be generated using semiconductor circuits.

SUMMARY OF THE INVENTION

This invention provides an improved circuit for detecting the transmitted synchronizing burst (usually called the "color burst") and generating a correction signal for use in controlling the oscillator. Advantageously, the circuit of this invention can also generate signals for use in automatic gain control.

According to this invention, a circuit suitable for processing a color burst signal and generating a control signal therefrom, comprises a first and a second pair of transistors. The transistors in the first pair are interconnected so that when turned on, they produce equal collector currents. Each transistor in the second pair of transistors is connected to a corresponding transistor in the first pair such that when on, it draws all or part of the collector current from its corresponding transistor in the first pair. The difference between the output signal from the reference oscillator and the color burst signal is used to turn on a first transistor in the second pair while the second transistor in this pair is turned on by the color burst alone. Only when this first transistor is on do the transistors in the first pair turn on. If the frequency or phase of the color burst differs from the frequency or phase of the output signal from the oscillator, a difference is created between the current drawn by the second transistor in the second pair and the current supplied by the corresponding transistor in the first pair. This unbalance in current is used to either charge or discharge a capacitor, the voltage level of which then controls the frequency and phase of the subcarrier regenerator oscillator to match the frequency and phase of the color burst signal.

An alternative embodiment of this invention detects the amplitude of the horizontal synchronizing pulse, transmitted between horizontal lines, and compares this to a reference voltage. A difference in voltage between these two signals again unbalances the circuit and generates a control signal for use in adjusting the gain of the receiver.

A third embodiment of this invention generates a voltage proportional to the amplitude of the color burst. This voltage is used for gain control of the color intermediate frequency amplifier.

DESCRIPTION OF THE DRAWINGS

FIGS. 1, 2 and 3 show three embodiments of this invention;

DETAILED DESCRIPTION

Figure 2:
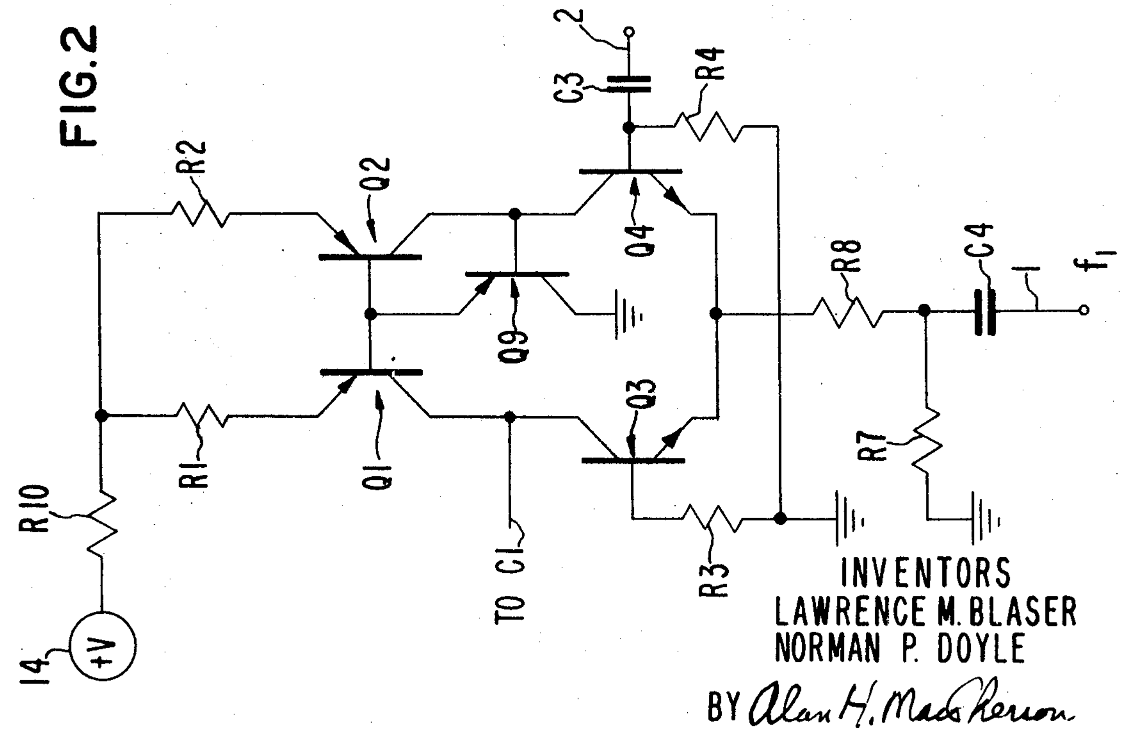
Figure 3:
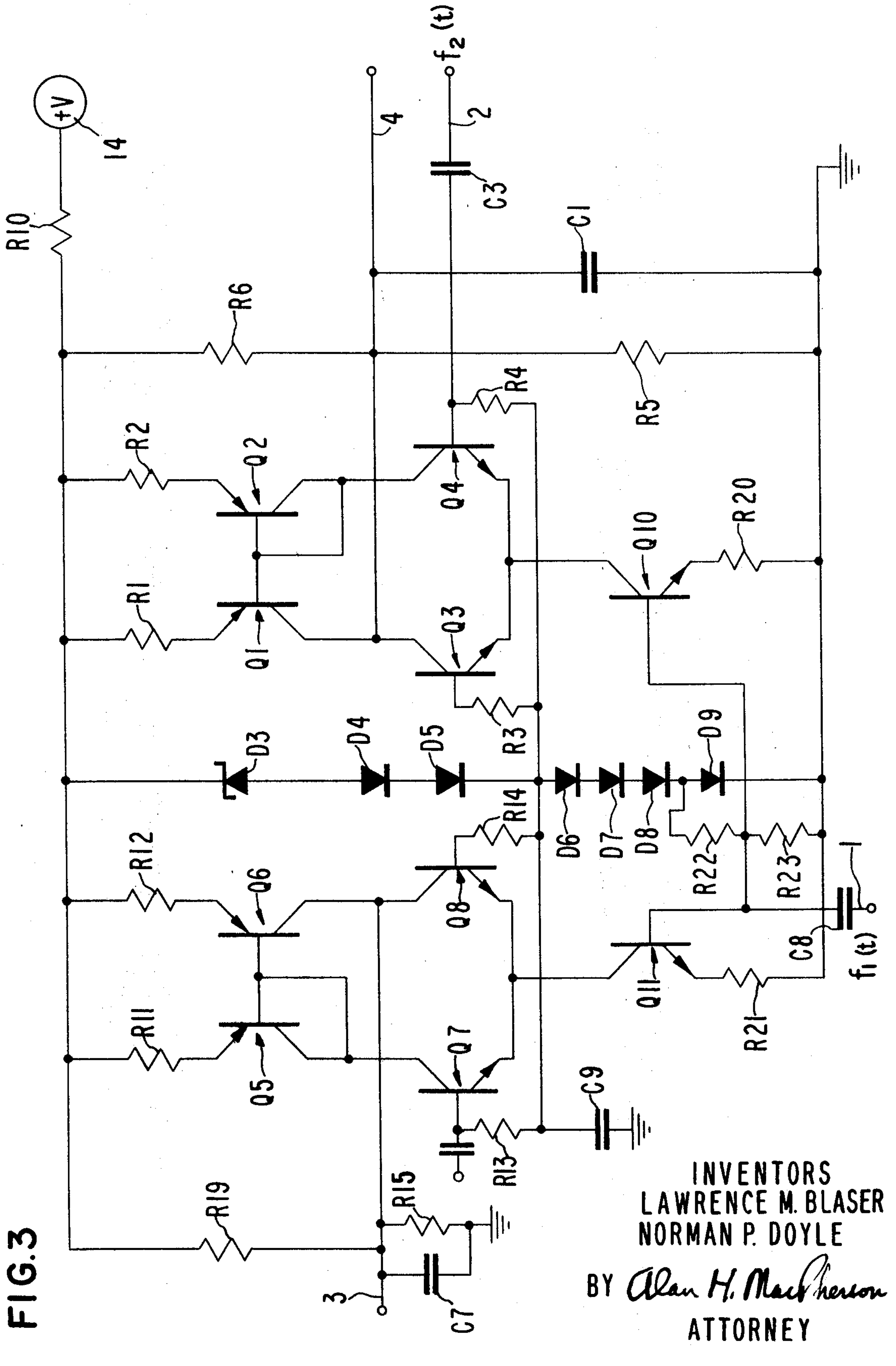

FIG. 1 shows one embodiment of this invention. It should be noted that identical elements in FIGS. 1, 2 and 3 are numbered identically for ease of comparison. Furthermore, while the operation of the invented circuit will be described in terms of three functions, automatic phase control (hereafter referred to as APC), automatic gain control (hereafter referred to as AGC) and automatic color control (hereafter referred to as ACC), the circuit has a wide variety of other uses in processing a variety of signals. Thus the description of the operation of this circuit is exemplary only and does not restrict the circuit to only the uses described.

The circuit shown in FIG. 1 contains two of the synchronous, balanced, detecting circuits of this invention. The operation of the invented circuit will be described referring first to transistors Q1 through Q4.

Two input signals $f_1(t)$ and $f_2(t)$, where $t$ represents time, are used to activate the balanced, synchronous, detector circuit of this invention. The operation of this circuit will first be described in conjunction with its use to control the frequency and phase of a voltage controlled oscillator, typically the subcarrier regenerator oscillator used in a color television receiver. Such an oscillator is shown in FIG. 1 by the dashed lines labeled 5.

To control the output signal from oscillator 5, a color burst (the characteristics of which are specified by the National Television Systems Committee) is transmitted during the flyback of the electron beam between each horizontal line of the scope. Containing approximately eight (8) sinusoidal cycles, the color burst has a carefully controlled frequency of about 3.58 megahertz. Received by antenna 8, the color burst is passed through processor 7 which contains the tuner, video IF amplifier, chroma IF amplifier, and video detector and then on lead 12 to input terminal 1 to the circuit of FIG. 1.

Figures 4A, 4B, 4C, 4D:
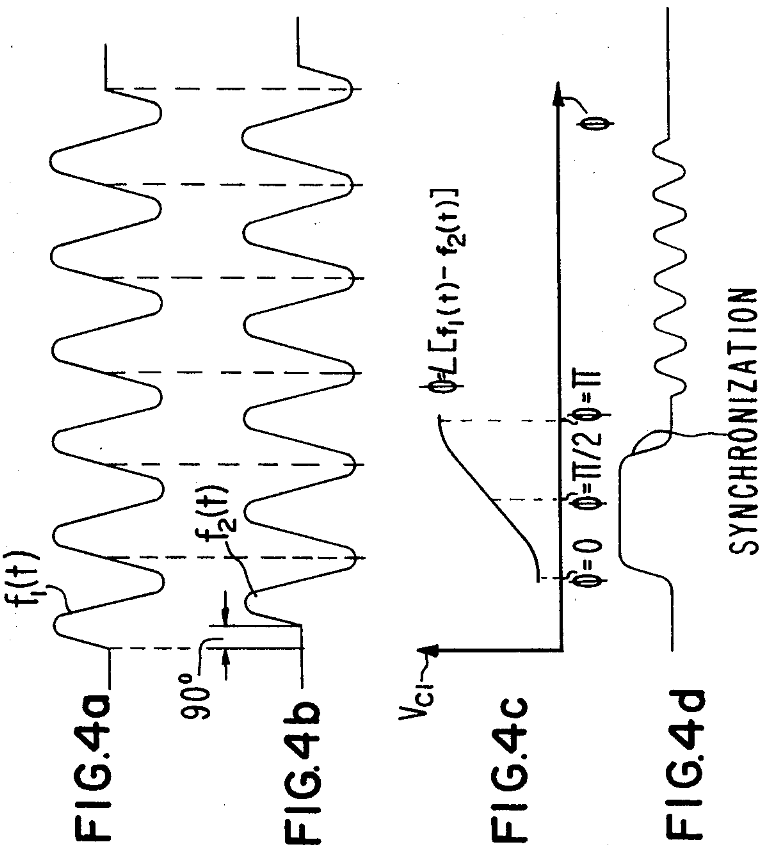
FIGS. 4*a* through 4*d* show waveforms of use in explaining the operation of this invention.

FIG. 4*a* shows the voltage generated at node *a* between capacitor C4 and resistor R7 by the color burst. Normally, the emitters of transmitters Q3 and Q4 are held at ground potential. The bases of transistors Q3 and Q4 are referenced to ground potential through resistors R3 and R4. During each positive half-cycle of the color burst, the voltage at node *a* increases to a positive value thereby reverse-biasing the base-emitter junctions of transistors Q3 and Q4. During each negative half-cycle of the color burst, the emitters of transistors Q3 and Q4 are biased to a negative potential thereby forward biasing the base-emitter junctions of these transistors. When the voltage across the base-emitter junctions of these two transistors becomes greater than about 0.6 volts, the voltage drop across a forward-based silicon *p–n* junction, transistors Q3 and Q4 turn on. In the absence of a signal on terminal 2 supplied to the base of transistor Q4 through capacitor C3, the collector currents drawn by transistors Q3 and Q4 are equal. Resistors R3 and R4 provide a path for the bias currents of transistors Q3 and Q4.

Transistors Q1 and Q2 have their emitters connected to a source 14 of positive voltage through resistor R10 and emitter resistors R1 and R2. Transistor Q2 has its base coupled to its collector as taught by Widlar, in U.S. Pat. No. 3,320,439, issued May 16, 1967. Thus, when the current gains of these two transistors are high, the collector current of transistor Q2 matches the collector current of transistor Q1. When transistors Q3 and Q4 are turned on solely by the color burst, transistors Q1 and Q2 are also turned on, and the collector currents from transistors Q1 and Q2 become the collector currents of transistors Q3 and Q4, respectively. In this situation no current flows on lead 4*a* from the collector of transistor Q1 or to the collector of transistor Q3 to charge or discharge capacitor C1.

Capacitor C1 is normally charged to a voltage equal to the voltage drop produced across resistor R5. Resistor R5 is connected in series with resistors R6 and R10 to form a voltage divider between voltage source 14 and ground. When no current flows on lead 4*a* to either charge or discharge capacitor C1, the voltage across capacitor C1 remains at the value determined by resistors R5, R6 and R10. This voltage is transmitted on lead 4 to voltage-controlled oscillator 5 where it is used to control the frequency and phase of the output signal from this oscillator.

Referring to FIG. 1, at the time of the occurrence of the color burst $f_1(t)$, a signal applied to gate 15 allows the output signal from oscillator 5 to pass to input terminal 2 and through capacitor C3 to the base of transistor Q4. When the frequency of the signal from oscillator 5 is different from the frequency of the synchronizing burst, the voltage on capacitor C1 changes and drives the frequency of the signal $f_2(t)$ from oscillator 5 to match the frequency of the color burst $f_1(t)$. It may take from one to many color bursts to obtain such a match.

The instantaneous value of the collector current of Q4 is determined by the instantaneous difference of the signals applied to the base and emitter of Q4. When $f_1(t)$ is in phase with $f_2(t)$ Q4 is not turned on and the collector current drawn by Q3 decreases, thereby decreasing the voltage across C1. When $f(t)$ leads $f_2(t)$ by up to 180° the resulting collector currents imbalance between Q3 and Q4 is such that the voltage across C1 increases.

The normal operating point for the circuit is with $f_1(t)$ and $f_2(t)$ having the same frequency and a 90° phase difference. FIGS. 4*a* and 4*b* depict $f_1(t)$ and $f_2(t)$ with $f_2(t)$ lagging $f_1(t)$ by 90°. The changes in voltage across capacitor C1 applied to oscillator 5 ensure that the phase difference between $f_1(t)$ and $f_2(t)$ returns to, or remains at, its nominal value. FIG. 4*c* shows the relationship between the voltage on capacitor C1 in FIG. 1 and the phase difference between $f_1(t)$ and $f_2(t)$.

Transistors Q5, Q6, Q7 and Q8 are connected in a manner identical to transistors Q1 through Q4. The color burst $f_1(t)$ is applied through capacitor C5 to the node between resistors R17, R18 and this capacitor. Transistors Q7 and Q8 are turned on in the same manner as are transistors Q3 and Q4. Transistors Q5 and Q6 are balanced, matched transistors, connected to operate in the same manner as do transistors Q1 and Q2. Emitter resistors R11 and R12 may be equal. An unbalance in the collector currents in transistors Q7 and Q8 charges capacitor C7, the voltage on which is used to control the gain of the chroma IF amplifier contained in processor 7. Processor 7 controls the amplitude of the received signal $f_1(t)$. The input signal $f_3(t)$ on lead 3 is the output signal $f_2(t)$ from oscillator 5 phase-shifted 90° in network 6 to be in phase with $f_1(t)$. When the amplitude of $f_3(t)$ equals the amplitude of the color burst $f_1(t)$, transistor Q7 remains off, thereby preventing both transistors Q5 and Q6 from turning on. Transistor Q8 is turned on, however, and its collector current is drawn from capacitor C7, maintaining a negative charge on this capacitor. When the amplitude of the color burst $f_1(t)$ is greater than the amplitude of $f_3(t)$, the base-emitter junction of transistor Q7 is still back-biased during both the positive and negative half-cycles of $f_1(t)$. This is ensured by bias resistors R16 and R17 which prevent the base-emitter junction of Q7 from becoming forward biased during the negative half-cycles of $f_1(t)$ even though the difference $f_3(t)–f_1(t)$ is positive during this negative half-cycle. On this negative half-cycle, transistor Q8 is turned on hard and its collector current is drawn from capacitor C7. Thus the negative charge on capacitor C7 increases in absolute magnitude. This increase in the negative voltage across capacitor C7 is transmitted on lead 11 to signal processor 7 and there is used to decrease the amplitude of the color burst $f_1(t)$.

On the other hand, if the amplitude of the color burst $f_1(t)$ is less than the amplitude of $f_3(t)$, transistor Q7 again remains off during both the positive and the negative half-cycles of $f_1(t)$. Bias resistors R16 and R17 connected in series with resistor R10 between voltage source 14 and ground ensure that the emitter voltage of Q7 is sufficiently high during the positive half-cycle of $f_1(t)$ that the base-emitter junction of transistor Q7 remains back-biased. On the negative half-cycle of $f_1(t)$, however, Q8 turns on but draws less collector current than it does when the amplitudes of $f_1(t)$ and $f_3(t)$ are equal. Consequently, the charge on capacitor C7 is less negative than when $f_1(t)$ equals in amplitude $f_3(t)$. Processor 7 responds to this change in voltage on capacitor C7 to increase the amplitude of $f_1(t)$.

Zener diodes D1 and D2 are used to control the bias voltage applied across voltage dividers R6, R5 and R15, R19 and thus to control the normal bias voltage on capacitors C1 and C7.

FIG. 2 shows an embodiment of this invention wherein transistors Q1 and Q2 are no longer required to have high current gain. Transistor Q9, connected as an emitter-follower, has its collector grounded, its base connected to the collector of transistor Q2 and its emitter connected to the base of both transistor Q1 and Q2. When transistor Q4 is turned on, transistor Q2 is turned on to supply collector current to transistor Q4. Transistor Q9 supplies the base currents of transistors Q2 and Q1, thus ensuing that the collector currents of Q1 and Q2 are approximately equal even though Q1 and Q2 do not have high current gains. Though not shown in FIG. 2, the collector of Q3 is connected to a source of current, such as capacitor C1 (FIG. 1).

FIG. 3 shows another embodiment of this invention employing gating transistors Q10 and Q11 together with biasing diodes D4 through D9. Color burst $f_1(t)$ is, as before, applied on input terminal 1 through capacitor C8. This color burst, however, turns on transistor Q10 which then serves as a current source drawing current from transistors Q3 and Q4. Diodes through D9 hold the bases of transistors Q3 and Q4 above the emitter voltages of these transistors by an amount such that transistor Q4 turns on in response to a very small amplitude color burst $f_{1X}(t)$. It should be noted here that the amplitude of the color burst necessary to turn on transistor Q4 in FIG. 1 is at least 0.6 volts, the voltage drop across the forward biased silicon *P–n* junction. The circuit in FIG. 3, however, is such that transistors Q3 and Q4 respond to a color burst with an amplitude significantly less than 0.6 volts. Thus a small amplitude color burst $f_1(t)$ increases the voltage on the base of transistor Q10 above the voltage drop across resistor R23. R23 is connected with resistor R22 as a divider network. When R22 is one-half the value of R23, and when diode D9 has a forward-biased voltage drop of about 0.6 volts, the voltage on the base of transistor Q10 is approximately 0.4 volts when transistor Q10 is off. In this situation, a color burst with an amplitude greater than 0.2 volts is needed to turn on transistor Q10 for at least a small portion of each cycle of the color burst thereby drawing emitter current from either transistor Q3 or Q4 or both. Changing the value of R22 vis-a-vis R23 changes the minimum amplitude of the color burst which turns on transistor Q10. The base bias voltages of transistors Q3 and Q4 are determined by the voltage drops across diodes D6 through D9. As before, the signal from oscillator 5 (not shown in FIG. 3) is coupled through capacitor C3 to the base of transistor Q4. The circuit works in identical fashion to that described above in conjunction with FIG. 1.

If desired, the emitter-follower transistor Q9 can be added as described in FIG. 2 to the circuit shown in FIG. 3.

The disclosed circuit is particularly useful in keyed or gated automatic gain control. In this application, the signal applied to terminal 1 is, as shown in FIG. 4*d*, the synchronization pulse, the amplitude of which is compared to a reference amplitude applied on terminal 2. When the two amplitudes are equal, transistor Q7 does not turn on. When the signal on terminal 1 has an amplitude different from that of the signal on terminal 2, transistor Q7 is turned on and generates a control voltage across capacitor C7 proportional to the disparity in amplitudes. This control voltage can then be used to control the gain of the video IF amplifier in processor 7.

The disclosed circuit can follow much higher flutter rates than can prior art circuits. Accordingly, television sets using the disclosed circuit give a much higher quality picture than do television sets using prior art circuits for the same function. The invented circuit is symmetrical in that the input can be attached to the base of either Q3 or Q4. Significantly, each of the transistor pairs shown in the circuits of FIGS. 1, 2 and 3 can be fabricated as matched pairs using integrated circuit techniques.

What is claimed is:

1. Structure which comprises:

a first pair of transistors and a second pair of transistors, the emitters of the first and second transistors in said first pair being connected through corresponding resistors to a power supply, and the bases of said first and second transistors in said first pair being connected together;

means connecting the bases of said first and second transistors in said first pair to the collector of the second transistor in said first pair;

a second pair of transistors, the collectors of the first and second transistors in said second pair being connected to the collectors of the first and second transistors in said first pair, respectively, the bases of said first and second transistors in said second pair being connected through resistors to ground, and the emitters of said first and second transistors in said second pair being connected together;

means coupling said emitters of said first and second transistors in said second pair to ground; and a resistor and a capacitor connected in parallel between ground and the collectors of said first transistors in said first and second pairs.

2. Structure as in claim 1 wherein said means coupling said emitters of said first and second transistors in said second pair to ground comprise a resistive divider network.

3. Structure as in claim 2 including:

means for applying a first input signal to the connected emitters of said first and second transistors in said second pair; and means for applying a second input signal to the base of one of the two transistors in said second pair.

4. Structure as in claim 3 wherein said resistive divider network comprises two series-connected resistors; and said means for applying a first input signal to the connected emitters of said first and second transistors in said second pair comprises:

a capacitor connected to a node between said two series-connected resistors comprising said divider network, one lead to said capacitor comprising the input terminal on which said first input signal is applied to said connected emitters.

5. Structure as in claim 4 wherein said means for applying said second input signal to the base of one of said two transistors in said second pair comprises:

a second capacitor connected to the base of said one transistor in said second pair, one lead to which comprises an input terminal on which said second input signal is applied to the base of said one transistor in said second pair.

6. Structure as in claim 5 including a bias resistor connecting the node of said two series-connected resistors comprising said resistive divider network to said power supply.

7. Structure as in claim 1 wherein said means connecting the bases of said first and second transistors in said first pair to the collector of the second transistor in said first pair comprises:

a transistor, the emitter of which is connected to the bases of said first and second transistors in said first pair, the collector of which is grounded, and the base of which is connected to the collector of said second transistor in said first pair.

8. Structure as in claim 1 including resistive means interconnecting to a power supply, and in series with, said resistor and capacitor connected in parallel; and two series-connected, back-biased Zener diodes connected in parallel across said resistive means and said resistor and capacitor connected in parallel.

9. Structure as in claim 8 wherein said resistive means comprises:

a plurality of resistors connected in series.

10. Structure as in claim 1 wherein said means coupling said emitters of said first and second transistors in said second pair to ground comprise a transistor, the collector of which is connected to the connected emitters of said first and second transistors in said second pair, the emitter of which is connected through a resistor to ground, and the base of which is connected through a capacitor to the input terminal on which said first input signal is applied.

11. Structure as in claim 10 including:

a second resistive divider network comprising a plurality of diodes connected in series between said power supply and ground, the bases of said first and second transistors in said second pair being connected through resistors to a node held above ground by a selected number of said diodes;

two series-connected resistors connected in parallel with one diode in said plurality of diodes, the base of said coupling transistor being connected to the node between said two resistors, and one terminal of said diode being connected to ground.